United States Patent [19]
Dolowy, Jr. et al.

[11] Patent Number: 5,306,571
[45] Date of Patent: Apr. 26, 1994

[54] METAL-MATRIX-COMPOSITE

[75] Inventors: Joseph F. Dolowy, Jr., Oxnard, Calif.; Bradley A. Webb, Las Vegas, Nev.; Mark van den Bergh, Thousand Oaks, Calif.

[73] Assignee: BP Chemicals Inc., Advanced Materials Division, Cleveland, Ohio

[21] Appl. No.: 847,259

[22] Filed: Mar. 6, 1992

[51] Int. Cl.$^5$ .................. B32B 15/00; C22C 1/09
[52] U.S. Cl. .................... 428/608; 428/611; 428/614; 428/654; 428/675; 174/252; 361/707; 361/720
[58] Field of Search ............. 428/611, 634, 654, 675, 428/614, 901, 608; 174/252; 361/387, 386, 388, 704, 705, 707, 720; 165/185

[56] References Cited

U.S. PATENT DOCUMENTS

| | | | |
|---|---|---|---|
| 3,384,463 | 5/1968 | Olstowski et al. | 29/180 |
| 3,616,115 | 10/1971 | Klimmek | 428/614 |
| 4,211,603 | 7/1980 | Reed | 156/659.1 |
| 4,226,917 | 10/1980 | Tsuruoka et al. | 428/614 |
| 4,318,954 | 3/1982 | Jensen | 428/209 |
| 4,609,586 | 9/1986 | Jensen et al. | 428/209 |
| 4,654,248 | 3/1987 | Mohammed | 428/137 |
| 4,657,797 | 4/1987 | Nied | 428/64 |
| 4,687,695 | 8/1987 | Hamby | 428/192 |
| 4,800,461 | 1/1989 | Dixon et al. | 361/398 |
| 4,812,792 | 3/1989 | Leibowitz | 361/414 |
| 4,849,858 | 7/1989 | Grapes et al. | 361/388 |
| 4,878,152 | 10/1989 | Saudaza et al. | 174/252 |
| 4,963,414 | 10/1990 | LeVasseur et al. | 428/195 |
| 5,039,577 | 8/1991 | Knoell et al. | 428/654 |

FOREIGN PATENT DOCUMENTS 2667615  4/1992  France.
1-319638  12/1989  Japan.

Primary Examiner—Michael Lewis
Assistant Examiner—N. M. Nguyen
Attorney, Agent, or Firm—Renner, Kenner, Greive, Bobak, Taylor & Weber

[57] ABSTRACT

An improved PWB thermal plane assembly having a low CTE and high thermal conductivity comprising a first and second outer layer of aluminum, at least one intermediate layer comprising a metal matrix reinforced with graphite fibers and a layer of aluminum disposed about the outside edge of said outer and intermediate layers.

9 Claims, 1 Drawing Sheet

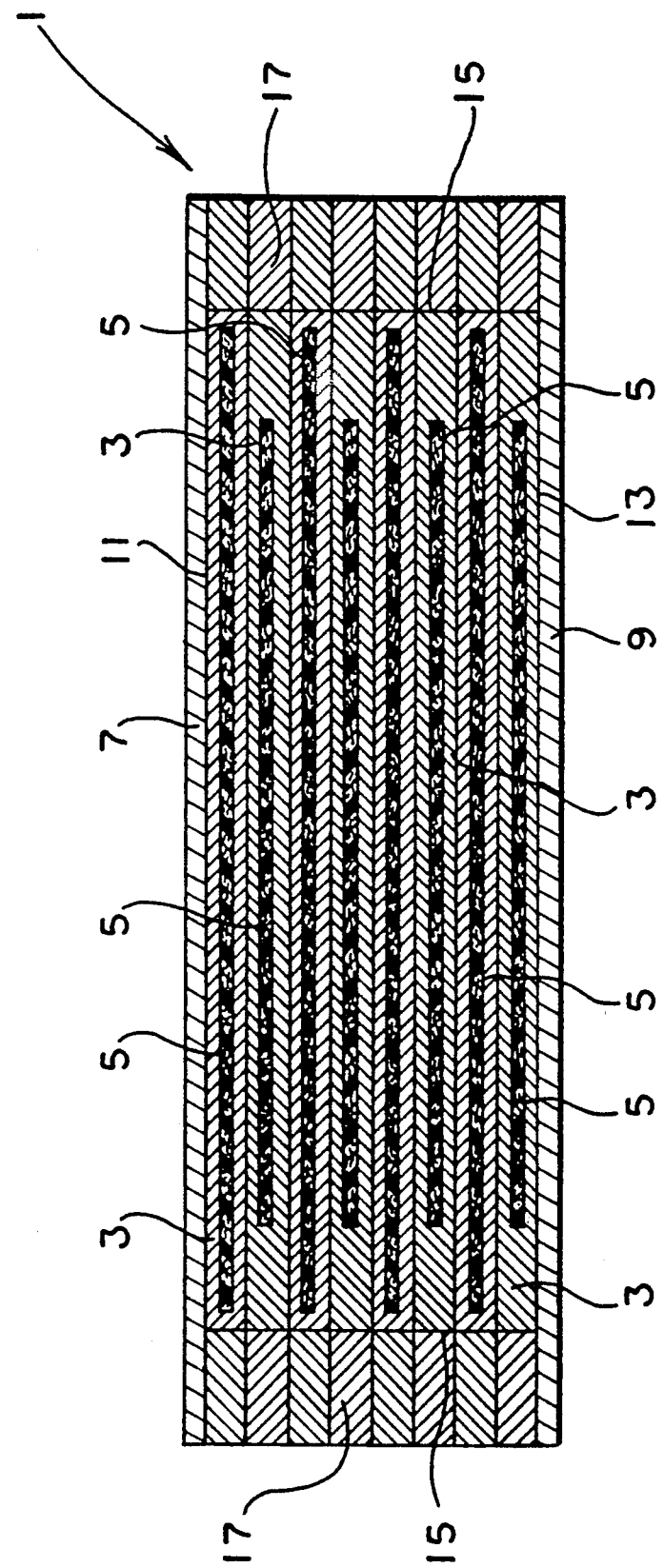

METAL-MATRIX-COMPOSITE

BACKGROUND OF THE INVENTION

The present invention relates to improved printed wiring board (PWB) thermal planes having a low coefficient of thermal expansion and high thermal conductivity. In particular, the present invention is directed to a graphite reinforced metal thermal plane for use with a PWB having a dissimilar thermally conductive material about the free edge surface of the composite.

PWB thermal plane assemblies are well known in the electronics industry. Such assemblies consist typically of PWB constructed of thermosetting resin matrix reinforced with fibrous material. The fibrous reinforced material is normally glass, although other dielectric reinforced materials such as quartz and aramid have also been used. The printed wiring board is completed by the creation of appropriate patterns of electrically conductive material on one or both surfaces of the board. The coefficient of thermal expansion and the thermal conductivity of the printed wiring board are two important characteristics in this formation. Large differences in the coefficient of thermal expansion between the printed wiring board and the components, solder and plating on the board will result in solder joint cracking when the assembly is subjected to temperature variation. Therefore, it is important to match the coefficient of thermal expansion (CTE) in the plane of the PWB to the CTE of the ceramic chip carriers or other chip carriers placed on the PWB. The thermal plane act to restrain the PWB given its lower CTE.

In addition, the PWB thermal plane assembly must have an acceptable thermal conductivity because convection cooling of electronic components is not possible or practical in many cases. It is therefore desirable to produce a PWB thermal plane assembly having a thermal conductivity high enough to transfer large heat loads which are generated during operation of the electronic components utilizing the PWB. The high thermal conductivity of the PWB, however, has to be achieved without sacrificing other important properties such as the appropriate CTE. In U.S. Pat. No. 4,609,586, an appropriate printed wiring board substrate is disclosed which comprises a metal matrix reinforced graphite fiber. While the printed wiring board of U.S. Pat. No. 4,609,586 has suitable thermal expansion and thermal conductivity properties for use in printed wiring boards, it may be improved upon. The present invention is directed to a metal matrix reinforced graphite fiber printed wiring board having improved properties.

SUMMARY OF THE INVENTION

It is a primary object of the present invention to provide a PWB thermal plane assembly which exhibits low coefficient of thermal expansion with high thermal conductivity.

It is another object of the present invention to provide a method for production of a PWB thermal assembly having a reinforced edge to enable improved heat transfer.

Additional objects and advantages of the invention will be set forth in the description which follows and in part will be obvious from the description, or may be learned by the practice of the invention. The object and advantages of the invention may be realized and attained by means that the instrumentality and combination particularly pointed out in the appended claims.

To achieve the foregoing object and in accordance with the purposes of the invention as embodied and broadly described herein, the electrically and thermally conductive composite of the present invention comprises a laminate having a first and second outer layers comprising an electrically conductive material, at least one intermediate layer comprising a metal matrix reinforced with graphite fibers disposed between the first and second outer layers, and a layer of a thermally conductive material disposed about the perimeter of the outer and intermediate layers.

In a preferred embodiment of the present invention, the thermally conductive material is metal, especially preferred being aluminum.

In a still further preferred embodiment of the present invention, the intermediate layer comprises aluminum reinforced with graphite fibers which have been oriented in a single direction.

In another preferred embodiment of the invention, the electrically conductive composite comprises a plurality of intermediate layers comprising metal matrix reinforced with graphite fibers wherein alternating intermediate layers contain graphite fibers which have been oriented in a cross ply arrangement (e.g. 0°, 90°).

BRIEF DESCRIPTION OF THE DRAWING

The accompanying drawing which is incorporated and constitutes a part of this invention illustrates one embodiment of the invention and together with the description serve to explain the principles of the invention.

IN THE DRAWINGS

FIG. 1 is a cross sectional view of the thermally conductive composite of the present invention.

DETAILED DESCRIPTION OF THE INVENTION

Reference will now be made in detail to the present preferred embodiment of the invention an example of which is illustrated in the accompanying drawing. While the invention will be described in detail in connection with a preferred embodiment of making the composite, it will be understood that it is not intended to limit the invention to that embodiment or procedure. On the contrary, it is intended to cover all alternatives, modifications and changes within the spirit and scope of the appended claims attached hereto.

Support member 1 is composed of metal matrix 3 reinforced by graphite fibers 5, graphite fibers 5 preferably comprise 40-60% by volume of support member 1. In the drawing, support member 1 is illustrated as having multiple layers of graphite fiber 5. Typically, the fibers may be oriented in any direction desired. The quantity of graphite fibers in support member 1 is controlled by any conventional process such that the support member has the proper coefficient of thermal expansion. The metal matrix 3 is usually selected based upon thermal conductivity, weight, cost and other factors. Typically metals such as aluminum, magnesium and copper are utilized with aluminum being especially preferred.

A typical process for forming the support 1 involves the filament winding of graphite fiber multi-ended tow onto a drum and impregnating the spread tow with an aluminum powder/fugitive binder slurry by spray application. An alternative to this process is filament winding of the graphite fiber onto the drum after the fiber has passed through a similar powder/fugitive binder slurry bath. After drying the "pre-preg" or green lay-up is a thin sheet (about 0.005 inch) which can be cut to a desired size and stacked several layers thick with all the fibers running in a single direction (unidirectional or uniaxial) or cross-plied (0°/90° is most common). Thin surface layers of thermally conductive metal 7 and 9 respectively, are then attached to the outside surfaces 11 and 13, using a fugitive binder. A thermally conductive material 17 is now deposited about the outer exposed edges 15 of the graphite metal composite structure. Conductive material 17 is incorporated as a picture frame about the exposed edges 15 of support 1. The completed green lay-up is then inserted into a stainless steel retort. A vacuum is drawn and the retort is inserted into a hot press. After an off-gassing cycle to remove the fugitive binder, the green lay-up is consolidated via diffusion bonding to full density. The broad processing cycle for formation of an aluminum matrix composite comprising graphite fibers and aluminum is between 1000°–1200° F., 0.5–5.0 kpsi pressure for 10–40 minutes. Preferably, the processing cycle is between 1100°–1150° F., 0.5–3.5 kpsi pressure in 10–30 minutes processing. Most preferably, the processing temperature is between 1115°–1135° F., the pressure is between 1–2.5 kpsi and the time is 5–20 minutes.

Typically, the thermally conductive metal 7 and 9 is aluminum foils comparable in thickness to the graphite-aluminum ply thickness of the composite structure after consolidation (0.005 inch). The graphite-aluminum plies are cut to size, such that a maximum shear length interface is achieved to optimize the mechanical integrity of the composite at the transition region. The resulting metal-matrix composite having the thermally conductive material deposited about the outer exposed edges of the composite results in a printed wiring board thermal plane which has improved corrosion and environmental properties.

Any conventional fugitive binder may be utilized in the practice of the invention provided that the binder is capable of off gassing during the diffusion binding. The preferred fugitive binder used in the practice of the present invention is a mixture of acrylic and toluene ranging from 6–8:1 toluene to acrylic. This binder is made by DWA Composites Specialties Inc. of Chatsworth, Calif., and is not for sale.

The following example is set forth for purposes of illustrating a preferred embodiment of the present invention.

EXAMPLE

A lay-up is created using a surface foil measuring 6 in square. A first fiber layer (e.g. graphite-aluminum) measuring 5 in square is placed on the surface foil. The first Al foil picture frame measuring 6 in outside dimension and 5 in inside dimension is then placed onto the surface foil. The first layer of the lay-up is complete. A second layer is applied. A second fiber layer (same as first fiber layer) measuring 5.5 in square is placed on top of the first layer. It bridges over the first fiber layer and the first Al foil picture frame. A second Al foil picture frame is then applied measuring 6 in outside dimension and 5.75 in inside dimension. Essentially, a "tongue in groove" interlocking edge is constructed as each additional layer is applied in the same fashion as just described. Fugitive binder is used to hold the layers in place. During the consolidation cycle, diffusion bonding occurs between the Al powder and Al picture frames (as well as the surface foils) and the lay-up becomes a fully integrated composite microstructure. The use of the tongue in groove edge design maximizes the shear area at the transition zone between Gr-Al composite and the monolithic Al edge.

While not being shown in the drawing, a preferred embodiment is that the aluminum frame material be interlocked at the corners to provide for improved strength in the composite board.

While the invention has been described in conjunction with the specific embodiments thereof, it is evident that any alternatives, modifications and variations will be apparent to those skilled in the art in light of the foregoing description. Accordingly, it is intended to embrace all such alternatives, modifications and variations as fall within the spirit and broad scope of the appended claims.

What we claim is:

1. A thermally conductive composite useful as a printed wiring board thermal plane comprising a consolidated laminate having a first and second outer layer comprising a thermally conductive metal, at least one intermediate layer disposed between said first and second outer layers comprising a metal matrix reinforced with graphite fiber, said outer end intermediate layers having outside edges and a layer of thermally conductive material disposed about the outside edges of said outer and intermediate layers wherein the thermally conductive metal and the thermally conductive material comprise aluminum.

2. The composite of claim 1 wherein the graphite fibers are oriented in a single direction.

3. The composite of claim 1 wherein the graphite fibers are oriented in a cross-ply arrangement.

4. The composite of claim 1 wherein the matrix metal is selected from the group consisting of aluminum, copper and magnesium.

5. The composite of claim 4 wherein the graphite fibers are oriented in a single direction.

6. The composite of claim 4 wherein the graphite fibers are oriented in a cross-ply arrangement.

7. A thermally conductive composite useful as a printed wiring board thermal plane comprising a consolidated laminate having a first and second outer layer comprising aluminum, at least one intermediate layer disposed between said first and second outer layers comprising an aluminum matrix reinforced with graphite fiber, said outer and intermediate layers having outside edges and a layer comprising aluminum disposed about the outside edges of said outer and intermediate layers.

8. The composite of claim 7 wherein the graphite fibers are oriented in a single direction.

9. The composite of claim 7 wherein the graphite fibers are oriented in a cross-ply arrangement.

* * * * *